(12) United States Patent
Fort et al.

(10) Patent No.: US 9,836,070 B2
(45) Date of Patent: Dec. 5, 2017

(54) REGULATOR WITH LOW DROPOUT VOLTAGE AND IMPROVED STABILITY

(71) Applicant: STMICROELECTRONICS (ROUSSET) SAS, Rousset (FR)

(72) Inventors: Jimmy Fort, Puyloubier (FR); Thierry Soude, Puyloubier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/937,671

(22) Filed: Nov. 10, 2015

(65) Prior Publication Data
US 2016/0062377 A1    Mar. 3, 2016

Related U.S. Application Data

(63) Continuation of application No. 13/827,044, filed on Mar. 14, 2013, now Pat. No. 9,190,969.

(51) Int. Cl.
*G05F 1/575* (2006.01)
*H03F 3/45* (2006.01)

(52) U.S. Cl.
CPC ......... *G05F 1/575* (2013.01); *H03F 3/45179* (2013.01)

(58) Field of Classification Search
CPC . G05F 1/56; G05F 1/575; G05F 1/565; G05F 1/573; G05F 1/569; G05F 1/567; G05F 1/5735; G05F 1/46; G05F 1/445; H02M 3/07; H02M 3/156; H02M 3/33507; H02M 3/33515; H03F 3/45183; H03F 3/45179; H03F 3/45192; H03F 3/45188; H03F 3/45475

USPC ........................................ 323/265, 273, 280
See application file for complete search history.

(56) References Cited

U.S. PATENT DOCUMENTS

| | | |
|---|---|---|
| 6,175,223 B1 | 1/2001 | Martinez et al. |
| 6,518,737 B1 | 2/2003 | Stanescu et al. |
| 6,788,146 B2 | 9/2004 | Forejt et al. |
| 7,235,959 B2 | 6/2007 | Sicard |
| 7,312,598 B1 | 12/2007 | Huang |
| 8,427,122 B2 | 4/2013 | Dasgupta |
| 2003/0111986 A1 | 6/2003 | Xi |
| 2009/0001953 A1 | 1/2009 | Huang |
| 2009/0085535 A1 | 4/2009 | Wei |
| 2009/0128104 A1 | 5/2009 | Mandal |
| 2012/0187930 A1 | 7/2012 | William et al. |

(Continued)

FOREIGN PATENT DOCUMENTS

| | | |
|---|---|---|
| EP | 1806640 | 7/2007 |
| WO | 9641248 | 12/1996 |

*Primary Examiner* — Jue Zhang
*Assistant Examiner* — Kevin H Sprenger
(74) *Attorney, Agent, or Firm* — Slater Matsil, LLP

(57) ABSTRACT

The regulator with a low dropout voltage comprises an error amplifier comprising a differential pair of input transistors and a circuit with folded cascode structure connected to the output of the said differential pair, an output stage connected to the output node of the error amplifier, and a Miller compensation capacitor connected between the output stage and the cascode node on the output side (XP) of the cascode circuit; the error amplifier furthermore comprises at least one inverting amplifier module in a feedback loop between the said cascode node and the gate of the cascode transistor of the cascode circuit connected between the said cascode node and the said output node.

27 Claims, 5 Drawing Sheets

(56) References Cited

U.S. PATENT DOCUMENTS

2013/0027010 A1    1/2013   Groeneweg et al.
2015/0061622 A1*  3/2015   Bhattad .................. G05F 1/573
                                                      323/280

* cited by examiner

REGULATOR WITH LOW DROPOUT VOLTAGE AND IMPROVED STABILITY

This is a continuation application of U.S. application Ser. No. 13/827,044, which was filed on Mar. 14, 2013, which claims the priority benefit of French patent application number 1252322, which was filed on Mar. 15, 2012. Each of these applications is incorporated herein by reference.

TECHNICAL FIELD

The invention relates to regulators with a low voltage drop, commonly denoted by those skilled in the art under the acronym LDO (Low Dropout Voltage) and, more particularly, to regulators whose error amplifier comprises a differential pair of input transistors, preferably PMOS transistors, and a circuit with differential folded cascode structure.

BACKGROUND

A regulator with a low voltage drop or low dropout voltage (difference between the voltage delivered at the output and the input voltage) allows a stable output voltage to be obtained regardless of the value of the output current demand.

The most widely used LDO regulator architecture comprises an error amplifier having a differential pair of input transistors, for example PMOS transistors, associated with a circuit having a folded cascode structure. However, such a structure suffers from a closed-loop instability. Accordingly, in order to improve the stability of the regulator, a capacitor, referred to as a Miller compensation capacitor, is generally placed between the output stage of the regulator and the cascode node situated on the output side of the error amplifier. This Miller compensation capacitor, configured in negative feedback mode, allows the dominant pole to be moved towards low frequencies, while at the same time shifting the output pole towards high frequencies. However, the combination of the Miller compensation capacitor and the impedance of the said cascode node leads to a third pole of this cascode node being obtained situated on the output side.

And, when the output current of the regulator increases, the output pole moves towards high frequencies, and at high currents, this output pole and the aforementioned third pole are then situated at neighboring frequencies, thus creating a complex conjugated pole which degrades the stability of the system.

BRIEF DESCRIPTION OF THE DRAWINGS

Other advantages and features of the invention will become apparent upon examining the detailed description of non-limiting embodiments, and of the appended drawings in which.

DETAILED DESCRIPTION OF ILLUSTRATIVE EMBODIMENTS

Before addressing the illustrated embodiments specifically, embodiments of the invention and advantageous features thereof will be discussed generally in the following paragraphs.

According to one embodiment, a regulator structure with a low dropout voltage is provided shifting the third pole (the pole at the cascode node) towards high frequencies, typically of the order of several decades, so as to distance it from the output pole and to thus improve the stability of the system, and to increase the bandwidth of the closed-loop regulator, in other words its reaction speed.

According to one embodiment, the solution is thus to shift the third pole towards high frequencies by reducing the impedance of the cascode node by the addition of an inverter amplifier, which allows the impedance of the cascode node to be divided by the gain of the inverter amplifier.

According to one aspect, a regulator with a low voltage drop or low loss voltage is provided, comprising an error amplifier comprising a differential pair of input transistors, preferably PMOS transistors, and a circuit with a differential folded cascode structure, connected to the output of the said differential pair, an output stage connected to the output node of the error amplifier, and a capacitor, referred to as a Miller compensation capacitor, connected between the output stage and the cascode node of the cascode circuit, situated on the output side of the error amplifier.

According to one general feature of this aspect, the error amplifier furthermore comprises at least one inverting amplifier module in a feedback loop between the said cascode node and the gate of the cascode transistor, connected between the said cascode node and the said output node of the error amplifier.

Several embodiments are possible for the inverting amplifier module. The latter may use a current-mode input or else a voltage-mode input.

One or more inverter amplifier modules may also be provided with an architecture of the 'single-ended' type (well known to those skilled in the art), or else for example, a single inverter amplifier module with a current-mode input using an architecture of the differential input/differential output type, with a common-mode voltage feedback control loop.

Figure 1:
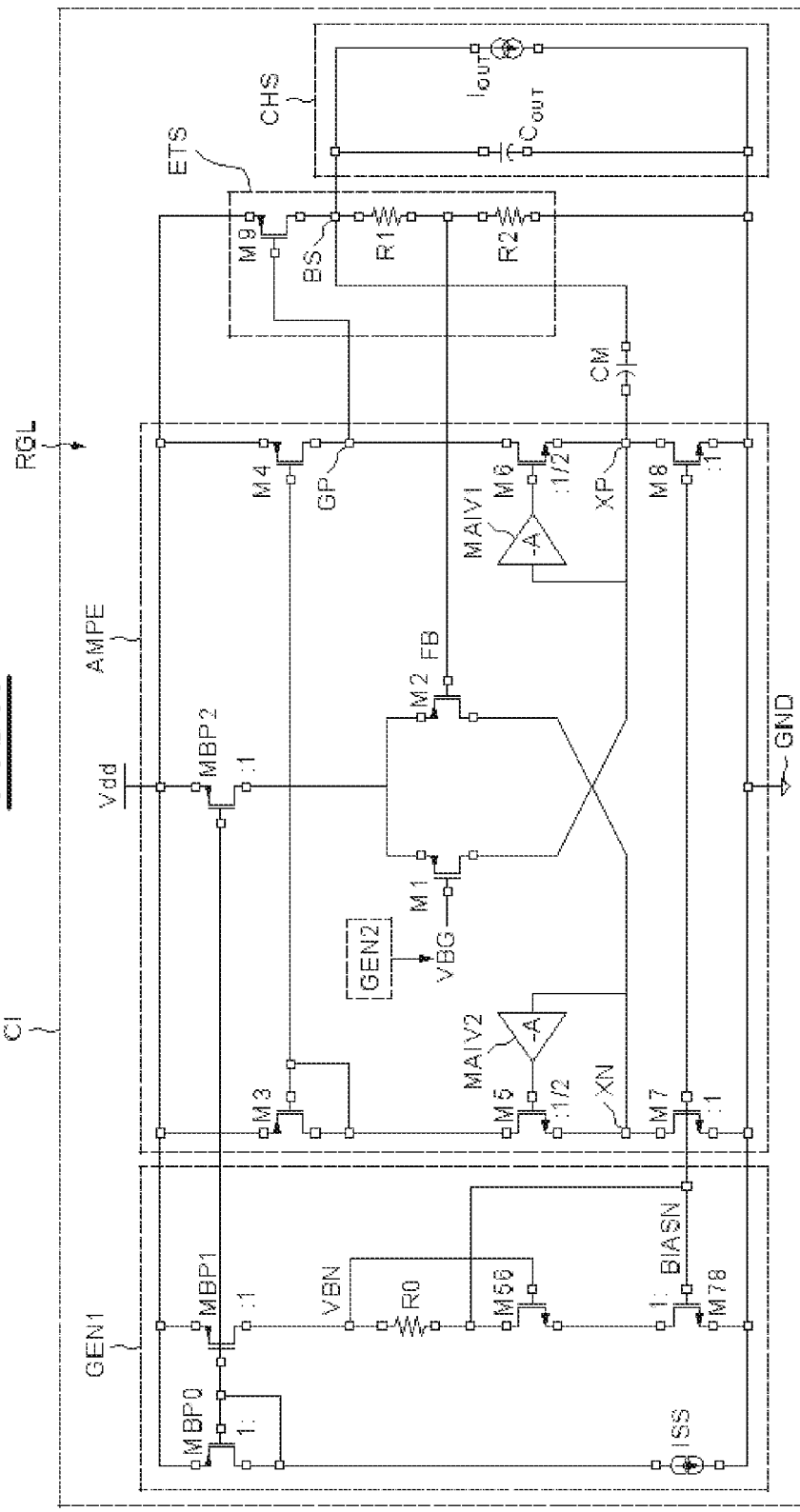
FIGS. 1 to 5 relate to various embodiments of a regulator according to the invention.

In FIG. 1, the reference RGL denotes a regulator with a low dropout voltage, comprising an error amplifier AMPE connected between a supply voltage Vdd and ground GND. This regulator is for example disposed within an integrated circuit CI.

The error amplifier AMPE comprises a differential pair of input transistors M1, M2, here PMOS transistors (although it is also possible to use NMOS transistors).

The use of PMOS transistors notably allows an input common mode with very low voltage to be obtained.

The gate of the transistor M1, which forms one of the inputs of the differential pair, is connected to a reference voltage VBG, which is here a bandgap voltage, generated by a generator GEN2 with a conventional structure known per se. This generator GEN2 can be disposed internally or externally to the regulator RGL.

The gate of the transistors M2 forms the other input of the differential pair. This other input receives the voltage FB whose value is connected to that of the output voltage delivered by the regulator, via a coefficient resulting from the presence of the voltage divider R1, R2 in the output stage ETS.

The error amplifier AMPE also comprises a circuit with differential folded cascode structure, connected to the differential output XN, XP of the differential pair. This cascode circuit comprises a biasing stage comprising the biasing transistors M7 and M8, cascoded by a cascode transistor stage M5, M6.

The nodes XN and XP form the two input cascode nodes of the cascode circuit. The folded cascode structure is here so called because the transistors of the cascode circuit are transistors of a type different from those of the differential pair. In other words, since the differential pair here comprises PMOS transistors, the transistors of the cascode circuit are NMOS transistors.

The error amplifier AMPE also comprises a current mirror formed by the transistors M3 and M4, allowing the amplifier AMPE to have a single output node GP formed by the drain of the PMOS transistor M4.

The bias of the differential pair M1 and M2 is provided by a PMOS transistor MBP2 connected between the supply voltage Vdd and the sources of the transistors M1 and M2 of the differential pair.

The bias voltages of the differential pair M1 and M2 and of the cascode circuit are obtained by another reference voltage generator GEN1, here comprising a current source ISS connected via a current mirror MBP0, MBP1 to a resistor R0 connected in series between the transistor MBP1 and ground, with an NMOS transistor M56 and an NMOS transistor M78.

The gate of the transistor MBP1 is connected to the gate of the transistor MBP2. A voltage VBN, available to the drain of the PMOS transistor MBP1, is also available on the gate of the transistor M56.

The common node between the resistance R0 and the drain of the NMOS transistor M56 is connected to the gate of the transistor M78 and also to the gate of the transistors M7 and M8.

Thus, a voltage BIASN is available to these gates. Consequently, a voltage difference exists between the two reference voltages VBN and BIASN. This voltage difference is of course chosen to be higher than the drain-source voltage VDS of a transistor in saturation, so as to allow the correct operation of the regulator. For example, a voltage difference equal to at least 100 mV could be chosen.

The generator GEN1 is here only one exemplary embodiment of a circuit delivering reference voltages VBN and BIASN. Of course, any known structure allowing reference voltages to be generated is suitable.

The regulator RGL also comprises an output stage ETS connected to the output node GP of the error amplifier AMPE.

This output stage ETS here conventionally comprises a PMOS transistor M9 connected in series with a resistive circuit (voltage divider) R1, R2 between the supply voltage Vdd and ground GND.

The gate of the transistor M9 is connected to the output node GP, whereas the mid-point of the voltage divider R1, R2 is connected to the input of the differential pair M1, M2 and delivers the voltage FB.

The drain of the transistor M9 forms the output terminal BS of the regulator RGL. This output terminal BS is connected to an output load CHS here represented by a current source $I_{out}$ and a capacitor $C_{out}$.

Another advantage of the use of PMOS transistors in the differential pair of the error amplifier resides in the fact that it becomes possible to have a voltage at the node GP close to the supply voltage Vdd. This then allows the PMOS transistor M9 to be placed in its non-conducting state (OFF) when the output load does not demand any current.

A Miller compensation capacitor CM is connected between the output stage (and, more particularly, to the output terminal BS) and the cascode node XP which is the cascode node situated on the output side of the error amplifier.

In order to reduce the impedance at the cascode node XP connected to the capacitor CM, and thus to shift the pole present at this node towards high frequencies so as to distance it from the pole present at the output BS of the regulator, the error amplifier AMPE advantageously comprises an inverting amplifier module MAIV1 in a feedback loop between the cascade node XP and the gate of the cascade transistor M6 which is connected between the cascade node XP and the output node GP of the error amplifier.

For this reason, the impedance at the node XP is divided by the gain A of the inverting amplifier module MAIV1.

Although it is sufficient to use only one amplifier module MAIV1 connected between the node XP and the cascode transistor M6, it is preferable, notably for reasons of matching and symmetry of the structure, to also provide a second inverting amplifier module MAIV2 in a feedback loop between the other cascode node XN and the other cascode transistor M5.

As will now be seen in more detail, several embodiments are possible for the inverting amplifier module or modules MAIV. It is notably possible to provide two inverting amplifier modules with a voltage input or with a current input or even a single inverting amplifier module with a differential input/differential output with a common-mode voltage feedback control loop.

Figure 2:
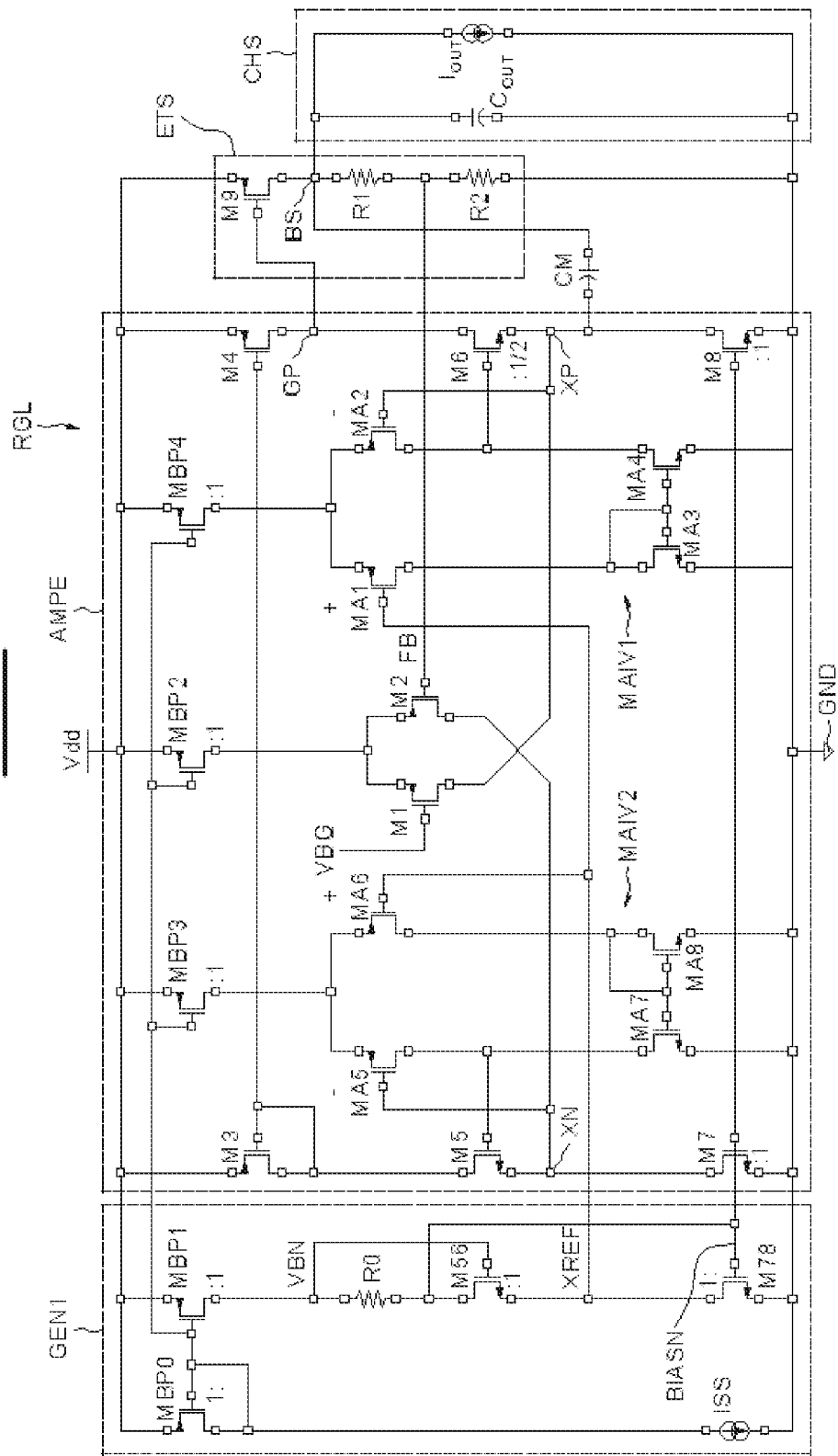

In FIG. 2, the two inverting amplifier modules MAIV1, MAIV2 are inverting amplifier modules with a voltage-mode input.

More precisely, the inverting amplifier module MAIV1 comprises two PMOS transistors MA1, MA2 whose gates respectively form the non-inverting and inverting inputs of the amplifier module MAIV1. The inverting input (gate of the transistor MA2) is connected to the cascode node XP, whereas the non-inverting input (gate of the transistor MA1) is connected to the source of the transistor M56, this gate therefore receiving a reference voltage XREF.

The drain of the transistor MA2, which forms the output of the amplifier module MAIV1, is also connected to the gate of the transistor M6. The inverting amplifier module MAIV1 also comprises a current mirror MA3, MA4 connected between the transistors MA1, MA2 and ground GND. The bias of the inverting amplifier module MAIV1 is notably provided by the PMOS transistor MBP4 connected between the supply voltage Vdd and the sources of transistors MA1, MA2, whose gate is connected to the gate of the transistor MBP1.

The second inverting amplifier module MAIV2 has a structure analogous to that of the module MAIV1.

More precisely, the module MAIV2 comprises a pair of input PMOS transistors MA5, MA6. The gate of the transistor MA6 forms the non-inverting input of the module MAIV2 and is also connected to the source of the transistor M56 and, consequently, to the non-inverting input of the module MAIV1.

The inverting input of the module MAIV2 (gate of the transistor MA5) is connected to the other cascode node XN.

The drain of the transistor MA5, which forms the output amplifier module MAIV2, is connected to the gate of the cascode transistor M5.

The module MAIV2 also comprises a current mirror formed by the NMOS transistors MA7, MA8, and the bias of this module MAIV2 is notably provided by the PMOS transistor MBP3 whose gate is connected to that of the transistor MBP1.

Of course, for the correct operation of the system, the various components of the generator GENT are chosen so that the sum of the voltage XREF, of the gate/source voltage of the transistor M6, of the drain/source voltage of the transistor MA2 and of the drain/source voltage of the transistor MBP4 is lower than the supply voltage Vdd.

Thus, typically, for a supply voltage of the order of 1.2 volts, a reference voltage XREF for example of the order of 100 millivolts is chosen.

Furthermore, this structure allows a controlled bias of the gate of the transistor M6 to be ensured. This bias is equal to the voltage VBN. Indeed, the inverting amplifier module MAIV1 aims to equalize the source voltages of the transistors M6 and M56. Furthermore, the current flowing through the transistor M6 is equal to half of the current flowing through transistor M56. However, since the size of the transistor M6 is only half the size of the transistor M56, the voltages VGS of these two transistors are equal, and consequently, their gate voltages are equal to VBN.

The voltage VBN is also replicated on the gate of the transistor M5. A controlled bias of the amplifier is thus obtained.

Figure 3:
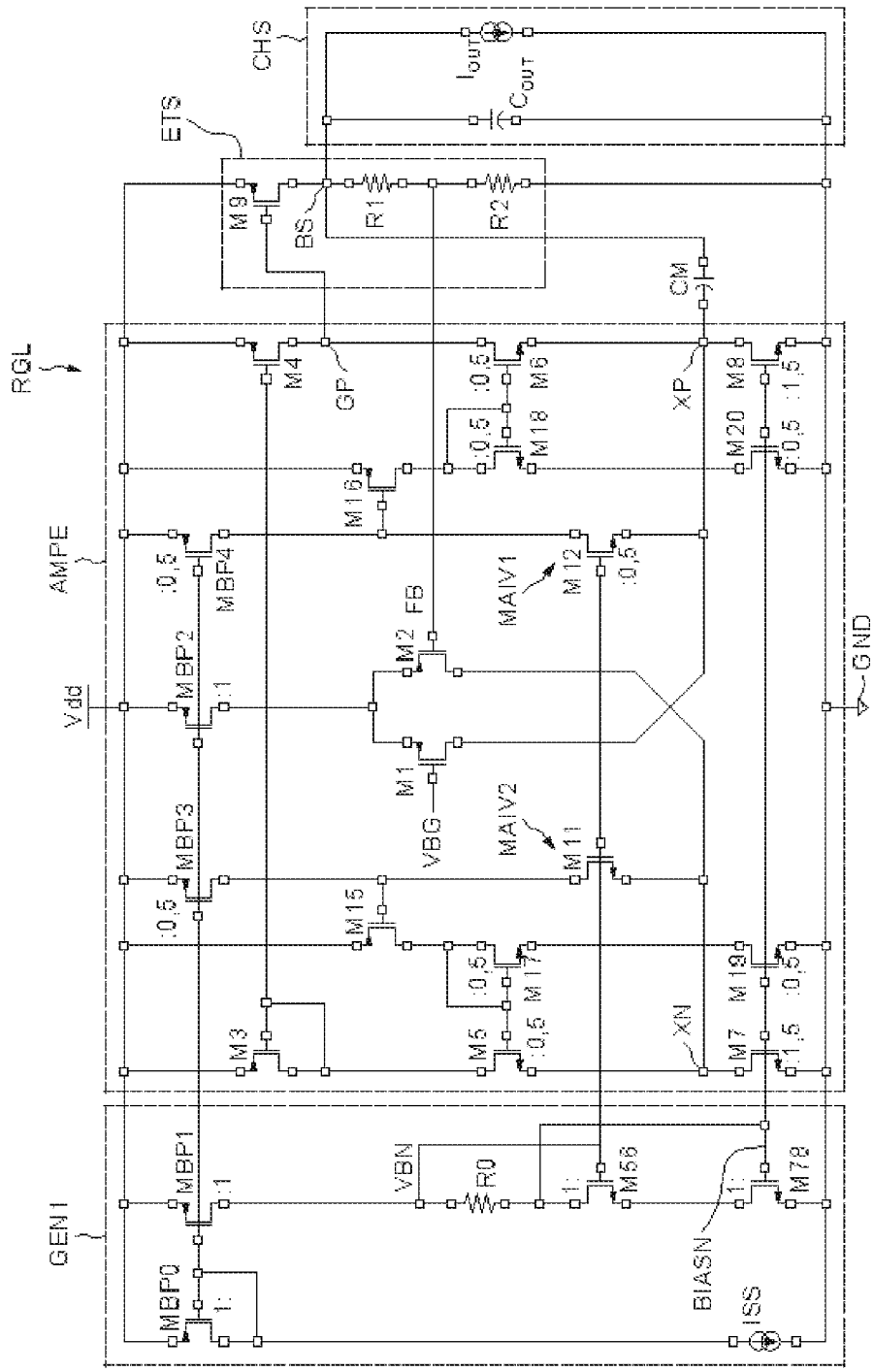

In the embodiment illustrated in FIG. 3, the two inverting amplifier modules MAIV1 and MAIV2 are this time two inverting amplifier modules with current-mode inputs (common gate configuration) using an architecture of the single-ended input/single-ended output type.

The use of amplifier modules with current-mode inputs integrates very well into a folded cascode structure and thus allows the amplifier to function correctly even with a very low bias voltage at the cascode node.

The inverting amplifier module MAIV1 here comprises two stages, namely a non-inverting first stage formed by the transistors M12 and MBP4 connected in series between the cascode node XP and the supply voltage Vdd, and a second inverting stage formed by the transistors M16, M18 and M20. The module MAIV1 is therefore in a feedback loop between the cascode node XP and the gate of the cascode transistor M6.

The transistor MBP4 forms an active load for the first stage.

The transistor M18 of the second stage is configured as a diode and the bias of this second stage is provided by the transistor M20 whose gate is connected to the gates of the biasing transistors M7 and M8.

The current-mode input of the amplifier module MAIV1 is formed by the source of the transistor M12.

Furthermore, since the transistors M12 and M6, of the same size, allow the same biasing current to flow, and they have an identical size, with their common source, they therefore exhibit the same VGS. Consequently, the voltage VBN, present on the gate of the transistor M12, is replicated on the gate of the transistor M6.

The inverting module amplifier MAIV2 has a similar structure to that of the amplifier module MAIV1.

More precisely, the module MAIV2 also comprises a non-inverting first stage formed by the transistors M11 and MBP3, connected to a second inverting stage formed by the transistors M15, M17 and M19.

The current-mode input of the module MAIV2 is formed by the source of the transistor M11 and the output of the module MAIV2 is formed by the gate of the transistor M17 configured as a diode.

Here again, the voltage VBN is replicated on the gate of the transistor M5.

It would be possible, in this embodiment, to eliminate the biasing transistors M19 and M20 and to directly connect the diode-configured transistors M17 and M18 to ground. This would allow the stability of the system to be further improved.

Figure 4:
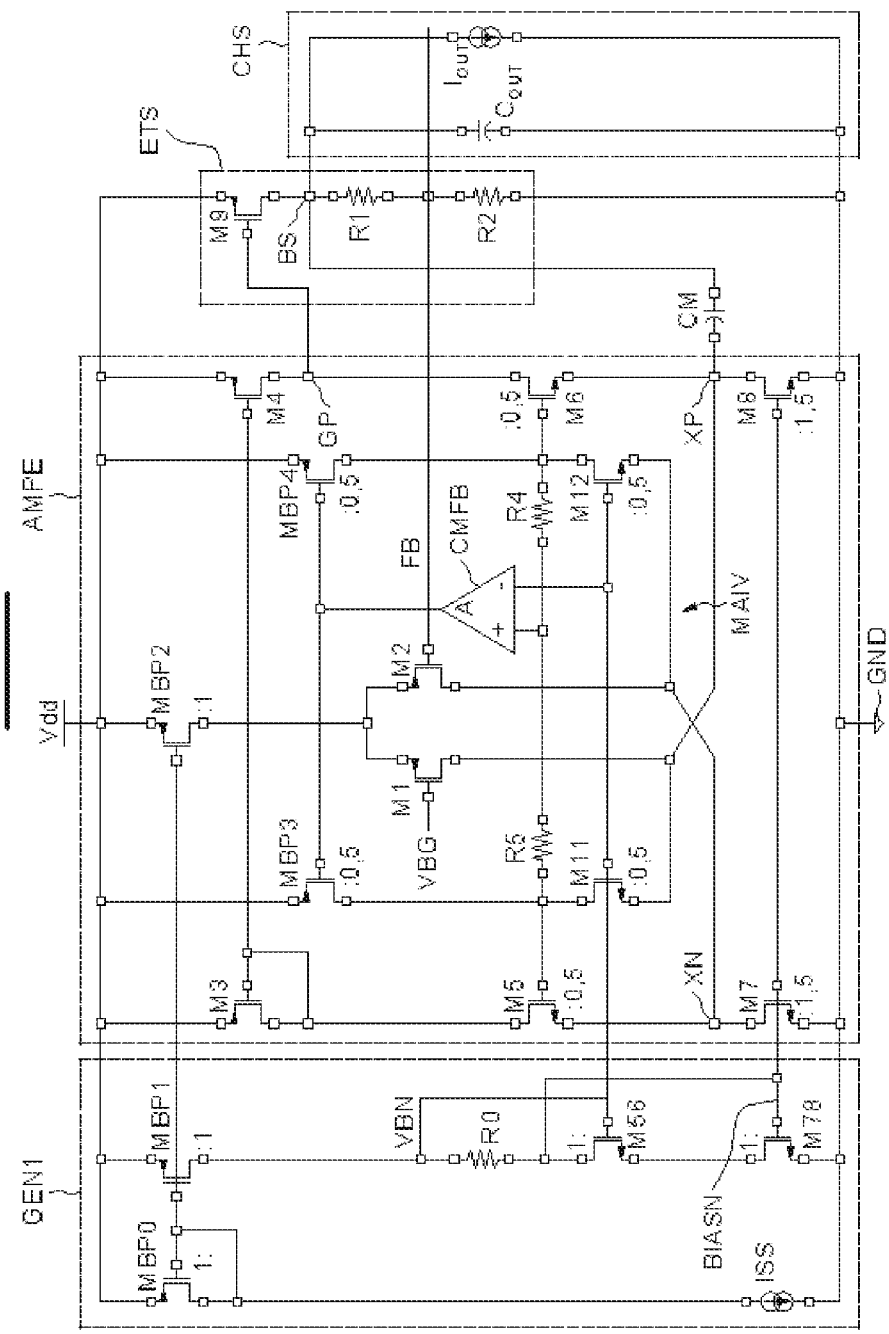

In the embodiments illustrated in FIG. 4, the two amplifier modules MAIV1 and MAIV2 in FIG. 3 are here replaced by a single inverting amplifier module MAIV having an architecture of the differential input/differential output type.

More precisely, the inverting amplifier module MAIV comprises the two NMOS transistors M11 and M12 whose current-mode inputs (sources) are this time respectively connected to the nodes XP and XN so as to create the inversion function.

The module MAIV also comprises the two PMOS transistors MBP3 and MBP4 connected in series between the supply voltage Vdd and the transistors M11 and M12.

The differential output of the module MAIV is formed by the drains of the transistors M11 and M12, which are respectively connected to the gates of the transistors M5 and M6.

The inverting amplifier module MAIV also comprises a common-mode voltage feedback control loop comprising an amplifier CMFB whose inverting input is connected to the gate of the transistors M11 and M12, whose non-inverting input is connected to the gate of the transistors M5 and M6 via two resistors R5 and R4 and whose output is connected to the gates of the transistors MBP3 and MBP4.

It can therefore be seen that the transistors MBP3 and MBP4 form an active load for the amplifier module MAIV.

This common-mode voltage of feedback control loop allows the gate voltages of the transistors M5 and M6 to be equalized to the voltage VBN.

The embodiment in FIG. 4 exhibits a greater stability than that in FIG. 3, since the amplifier module MAIV only comprises a single stage rather than two.

Figure 5:
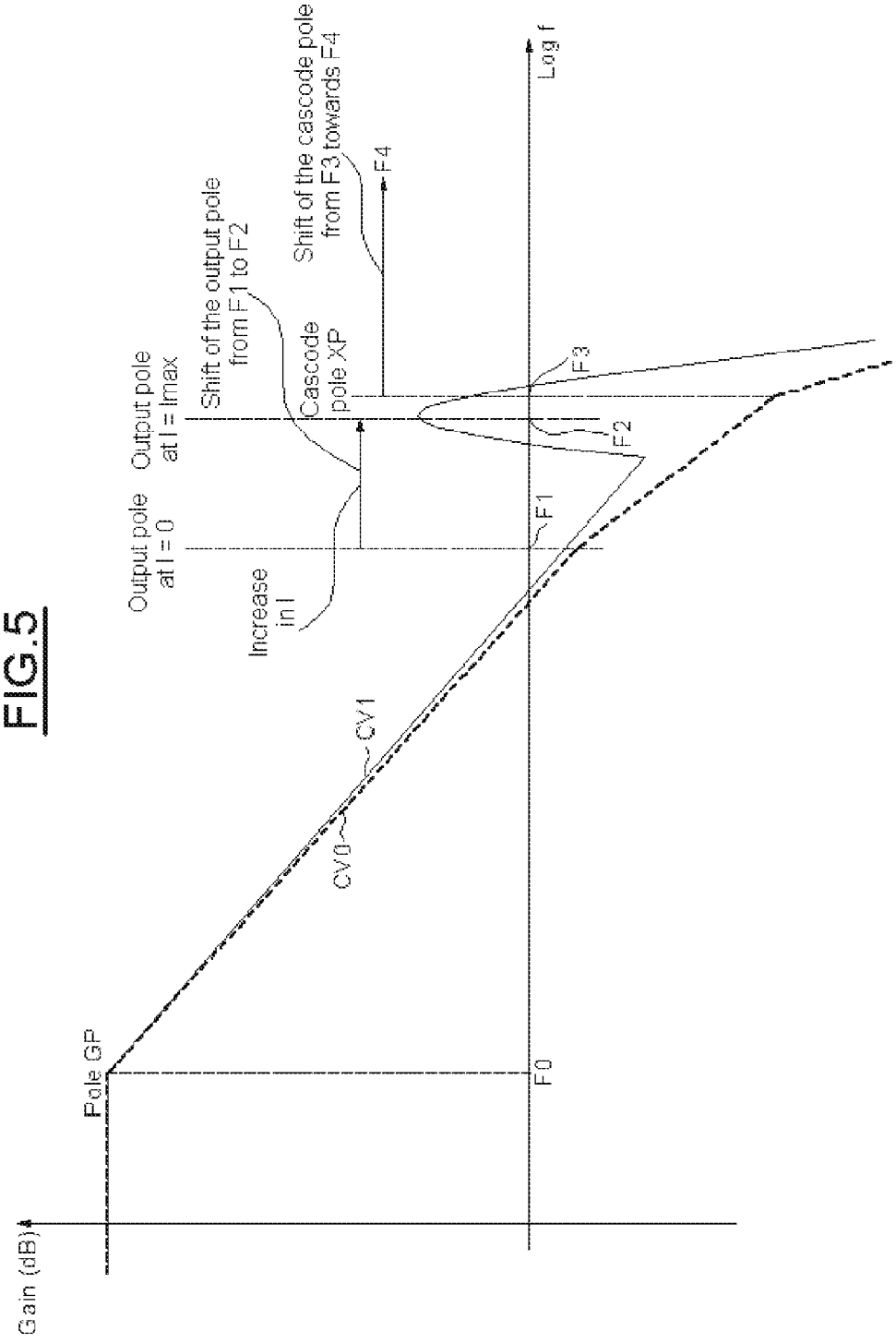

FIG. 5 illustrates the Bode diagram of the variations of the open-loop gain of the error amplifier as a function of frequency. The curve CV0 illustrates this variation for a zero current. It can be seen that the dominant pole (situated at the output node GP of the error amplifier) is situated at the frequency F0, whereas the output pole (at the terminal BS) is situated at the frequency F1 and the cascode pole XP is situated at the frequency F3.

The curve CV1 illustrates the variation of the gain when the current I is equal to the maximum current Imax. It can therefore be seen that, in the absence of an inverting amplifier at the cascode node, the output pole comes close to the cascode pole leading to an instability of the system. The regulator according to the invention allows, by way of the feedback loop with an inverting amplifier between the cascode node XP and the gate of the cascode transistor connected to this cascode node XP, the cascode pole to be shifted from the frequency F3 towards the frequency F4, which is higher than the frequency F3 by several decades, so as to preserve stability of the system.

What is claimed is:

1. A voltage regulator comprising:
   an output stage comprising an output transistor having a first output-transistor-conduction terminal coupled to a first output node and an output transistor-control terminal coupled to a second output node;
   an error amplifier comprising:
      a differential input stage coupled to a first bias node, a first cascode node, and a second cascode node,
      a first cascode transistor having a first first-cascode-transistor-conduction terminal coupled to the first cascode node and a second first-cascode-transistor-conduction terminal coupled to the second output node,
      a second cascode transistor having a first second-cascode-transistor-conduction terminal coupled to the second cascode node, a first inverting amplifier circuit having a first differential input coupled to a first bias reference node, a second differential input coupled to the first cascode node, and a single output coupled to a first-cascode-transistor-control terminal of the first cascode transistor, and a second inverting amplifier circuit having a first differential input coupled to the first bias reference node, a second differential input coupled to the second cascode node, and a single output coupled to a second-cascode-transistor-control terminal of the second cascode transistor; and a capacitor coupled between the first output node and the first cascode node.

2. The voltage regulator of claim 1, wherein:

the first inverting amplifier circuit comprises a first amplifier transistor having a first first-amplifier-transistor-conduction terminal coupled to a second bias node and a first-amplifier-transistor-control terminal coupled to the first bias reference node, a second amplifier transistor having a first second-amplifier-transistor-conduction terminal coupled to the second bias node, a second second-amplifier-transistor-conduction terminal coupled to the first-cascode-transistor-control terminal, and a first-amplifier-transistor-control terminal coupled to the first cascode node, and a first current mirror circuit coupled to the first amplifier transistor and the second amplifier transistor; and the second inverting amplifier circuit comprises a third amplifier transistor having a first third-amplifier-transistor-conduction terminal coupled to a third bias node and a third-amplifier-transistor-control terminal coupled to the first bias reference node, a fourth amplifier transistor having a first fourth-amplifier-transistor-conduction terminal coupled to the third bias node, a second fourth-amplifier-transistor-conduction terminal coupled to the second-cascode-transistor-control terminal, and a fourth-amplifier-transistor-control terminal coupled to the second cascode node, and a second current mirror circuit coupled to the third amplifier transistor and the fourth amplifier transistor.

3. The voltage regulator of claim 2, wherein the differential input stage comprises:

a first input transistor having a first first-input-transistor-conduction terminal coupled to the first bias node and a second first-input-transistor-conduction terminal coupled to a first cascode node; and a second input transistor having a first second-input-transistor-conduction terminal coupled to the first bias node and a second second-input-transistor-conduction terminal coupled to the second cascode node.

4. The voltage regulator of claim 3, wherein the first current mirror circuit comprises a first terminal coupled to a second first-amplifier-transistor-conduction terminal of the first amplifier transistor, a second terminal coupled to the second second-amplifier-transistor-conduction terminal of the second amplifier transistor, and a third terminal coupled to a first supply node; and the second current mirror circuit comprises a first terminal coupled to a second third-amplifier-transistor-conduction terminal of the third amplifier transistor, a second terminal coupled to the second fourth-amplifier-transistor-conduction terminal of the fourth amplifier transistor, and a third terminal coupled to the first supply node.

5. The voltage regulator of claim 4, wherein the output stage further comprises a resistive voltage divider coupled from the first output node to the first supply node, an intermediate node of the resistive voltage divider being coupled to a second-input-transistor-control terminal of the second input transistor.

6. The voltage regulator of claim 5, wherein a first-input-transistor-control terminal of the first input transistor is coupled to a bandgap reference node that is configured to receive a bandgap voltage reference signal.

7. The voltage regulator of claim 4, wherein the error amplifier further comprises:

a fifth amplifier transistor having a first fifth-amplifier-transistor-conduction terminal coupled to the first cascode node, a second fifth-amplifier-transistor-conduction terminal coupled to the first supply node, and a fifth-amplifier-transistor-control terminal coupled to a second bias reference node; and a sixth amplifier transistor having a first sixth-amplifier-transistor-conduction terminal coupled to the second cascode node, a second sixth-amplifier-transistor-conduction terminal coupled to the first supply node, and a sixth-amplifier-transistor-control terminal coupled to the second bias reference node.

8. The voltage regulator of claim 7, wherein the error amplifier further comprises:

a first bias transistor having a first first-bias-transistor-conduction terminal coupled to a second supply node, a second first-bias-transistor-conduction terminal coupled to the first bias node, and a first-bias-transistor-control terminal coupled to a third bias reference node;

a second bias transistor having a first second-bias-transistor-conduction terminal coupled to the second supply node, a second second-bias-transistor-conduction terminal coupled to the second bias node, and a second-bias-transistor-control terminal coupled to the third bias reference node; and a third bias transistor having a first third-bias-transistor-conduction terminal coupled to the second supply node, a second third-bias-transistor-conduction terminal coupled to the third bias node, and a third-bias-transistor-control terminal coupled to the third bias reference node.

9. The voltage regulator of claim 8, further comprising a bias reference circuit coupled to the first supply node and the second supply node, the bias reference circuit configured to generate and supply a first reference voltage to the first bias reference node, a second reference voltage to the second bias reference node, and a third reference voltage to the third bias reference node.

10. The voltage regulator of claim 4, wherein the error amplifier further comprises:

a first balancing transistor having a first first-balancing-transistor-conduction terminal coupled to a second supply node, a second first-balancing-transistor-conduction terminal coupled to the first first-cascode-transistor-conduction terminal, and a first-balancing-transistor-control terminal; and a second balancing transistor having a first second-balancing-transistor-conduction terminal coupled to the second supply node, a second second-balancing-transistor-conduction terminal coupled to the first second-cascode-transistor-conduction terminal, and a second-balancing-transistor-control terminal coupled to the first-balancing-transistor-control terminal, wherein the second-balancing-transistor-control terminal and the second second-balancing-transistor-conduction terminal are coupled together.

11. The voltage regulator of claim 3, wherein
the first input transistor and the second input transistor each comprise a PMOS transistor, and
the first cascode transistor and the second cascode transistor each comprise an NMOS transistor.

12. A voltage regulator comprising:
an output stage comprising an output transistor having a first output-transistor-conduction terminal coupled to a first output node and an output-transistor-control terminal coupled to a second output node;
an error amplifier comprising:
    a differential input stage coupled to a first bias node, a first cascode node, and a second cascode node,
    a first cascode transistor having a first first-cascode-transistor-conduction terminal coupled to the first cascode node and a second first-cascode-transistor-conduction terminal coupled to the second output node,
    a second cascode transistor having a first second-cascode-transistor-conduction terminal coupled to the second cascode node,
    a first inverting amplifier circuit having a current mode input coupled to the first cascode node and an output coupled to a first-cascode-transistor-control terminal of the first cascode transistor, and
    a second inverting amplifier circuit having a current mode input coupled to the second cascode node and an output coupled to a second-cascode-transistor-control terminal of the second cascode transistor; and
a capacitor coupled between the first output node and the first cascode node.

13. The voltage regulator of claim 12, wherein:
the first inverting amplifier circuit comprises
    a first amplifier transistor having a first first-amplifier-transistor-conduction terminal coupled to a second bias node, a second first-amplifier-transistor-conduction terminal coupled to the first cascode node, and a first-amplifier-transistor-control terminal coupled to a first bias reference node,
    a second amplifier transistor having a first second-amplifier-transistor-conduction terminal coupled to a first supply node, a second second-amplifier-transistor-conduction terminal, and a second-amplifier-transistor-control terminal coupled to the first first-amplifier-transistor-conduction terminal, and
    a third amplifier transistor having a first third-amplifier-transistor-conduction terminal coupled to the second second-amplifier-transistor-conduction terminal, a second third-amplifier-transistor-conduction terminal, and a third-amplifier-transistor-control terminal coupled to the first-cascode-transistor-control terminal, wherein the first third-amplifier-transistor-conduction terminal and the third-amplifier-transistor-control terminal are coupled together; and
the second inverting amplifier circuit comprises
    a fourth amplifier transistor having a first fourth-amplifier-transistor-conduction terminal coupled to a third bias node, a second fourth-amplifier-transistor-conduction terminal coupled to the second cascode node, and a fourth-amplifier-transistor-control terminal coupled to the first bias reference node,
    a fifth amplifier transistor having a first fifth-amplifier-transistor-conduction terminal coupled to the first supply node, a second fifth-amplifier-transistor-conduction terminal, and a fifth-amplifier-transistor-control terminal coupled to the first fourth-amplifier-transistor-conduction terminal, and
    a sixth amplifier transistor having a first sixth-amplifier-transistor-conduction terminal coupled to the second fifth-amplifier-transistor-conduction terminal, a second sixth-amplifier-transistor-conduction terminal, and a sixth-amplifier-transistor-control terminal coupled to the second-cascode-transistor-control terminal, wherein the first sixth-amplifier-transistor-conduction terminal and the sixth-amplifier-transistor-control terminal are coupled together.

14. The voltage regulator of claim 13, wherein the differential input stage comprises:
    a first input transistor having a first first-input-transistor-conduction terminal coupled to the first bias node and a second first-input-transistor-conduction terminal coupled to the first cascode node; and
    a second input transistor having a first second-input-transistor-conduction terminal coupled to the first bias node and a second second-input-transistor-conduction terminal coupled to the second cascode node.

15. The voltage regulator of claim 14, wherein
the first inverting amplifier circuit further comprises:
    a seventh amplifier transistor having a first seventh-amplifier-transistor-conduction terminal coupled to the first cascode node, a second seventh-amplifier-transistor-conduction terminal coupled to a second supply node, and a seventh-amplifier-transistor-control terminal coupled to a second bias reference node, and
    an eighth amplifier transistor having a first eighth-amplifier-transistor-conduction terminal coupled to the second third-amplifier-transistor-conduction terminal, a second eighth-amplifier-transistor-conduction terminal coupled to the second supply node, and an eighth-amplifier-transistor-control terminal coupled to the second bias reference node; and
the second inverting amplifier circuit further comprises:
    a ninth amplifier transistor having a first ninth-amplifier-transistor-conduction terminal coupled to the second cascode node, a second ninth-amplifier-transistor-conduction terminal coupled to the second supply node, and a ninth-amplifier-transistor-control terminal coupled to the second bias reference node, and
    a tenth amplifier transistor having a first tenth-amplifier-transistor-conduction terminal coupled to the second sixth-amplifier-transistor-conduction terminal, a second tenth-amplifier-transistor-conduction terminal coupled to the second supply node, and a tenth-amplifier-transistor-control terminal coupled to the second bias reference node.

16. The voltage regulator of claim 15, wherein the error amplifier further comprises:
    a first bias transistor having a first first-bias-transistor-conduction terminal coupled to the first supply node, a second first-bias-transistor-conduction terminal coupled to the first bias node, and a first-bias-transistor-control terminal coupled to a third bias reference node;
    a second bias transistor having a first second-bias-transistor-conduction terminal coupled to the first supply node, a second second-bias-transistor-conduction terminal coupled to the second bias node, and a second-bias-transistor-control terminal coupled to the third bias reference node; and a third bias transistor having a first third-bias-transistor-conduction terminal coupled to the first supply node, a second third-bias-transistor-conduction terminal coupled to the third bias node, and a third-bias-transistor-control terminal coupled to the third bias reference node.

17. The voltage regulator of claim 14, wherein the output stage further comprises a resistive voltage divider coupled from the first output node to a second supply node,
an intermediate node of the resistive voltage divider being coupled to a second-input-transistor-control terminal of the second input transistor.

18. The voltage regulator of claim 17, wherein a first-input-transistor-control terminal of the first input transistor is coupled to a bandgap reference node that is configured to receive a bandgap voltage reference signal.

19. The voltage regulator of claim 13, wherein the error amplifier further comprises:
a first balancing transistor having a first first-balancing-transistor-conduction terminal coupled to the first supply node, a second first-balancing-transistor-conduction terminal coupled to the first first-cascode-transistor-conduction terminal, and a first-balancing-transistor-control terminal; and
a second balancing transistor having a first second-balancing-transistor-conduction terminal coupled to the first supply node, a second second-balancing-transistor-conduction terminal coupled to the first second-cascode-transistor-conduction terminal, and a second-balancing-transistor-control terminal coupled to the first-balancing-transistor-control terminal, wherein the second-balancing-transistor-control terminal and the second second-balancing-transistor-conduction terminal are coupled together.

20. A voltage regulator comprising:
an output stage comprising an output transistor having a first output-transistor-conduction terminal coupled to a first output node and an output-transistor-control terminal coupled to a second output node;
an error amplifier comprising:
a differential input stage coupled to a first bias node, a first cascode node, and a second cascode node,
a first cascode transistor having a first first-cascode-transistor-conduction terminal coupled to the first cascode node and a second first-cascode-transistor-conduction terminal coupled to the second output node,
a second cascode transistor having a first second-cascode-transistor-conduction terminal coupled to the second cascode node,
a first amplifier circuit coupled to a first-cascode-transistor-control terminal of the first cascode transistor, an amplifier control node, the second cascode node, a first differential node, and a second differential node,
a second amplifier circuit coupled to a second-cascode-transistor-control terminal of the second cascode transistor, the amplifier control node, the first cascode node, the first differential node, and the second differential node, and
a differential amplifier having a first input coupled to the first differential node, a second input coupled to the second differential node, and an output coupled to the amplifier control node, wherein the first differential node is coupled to a first bias reference node; and a capacitor coupled between the first output node and the first cascode node.

21. The voltage regulator of claim 20, wherein:
the first amplifier circuit comprises
a first amplifier transistor having a first first-amplifier-transistor-conduction terminal coupled to a first supply node, a second first-amplifier-transistor-conduction terminal coupled to the first-cascode-transistor-control terminal, and a first-amplifier-transistor-control terminal coupled to the amplifier control node,
a second amplifier transistor having a first second-amplifier-transistor-conduction terminal coupled to the first-cascode-transistor-control terminal, a second second-amplifier-transistor-conduction terminal coupled to the second cascode node, and a second-amplifier-transistor-control terminal coupled to the first differential node, and
a first resistor having a first terminal coupled to the second differential node and a second terminal coupled to the first-cascode-transistor-control terminal; and
the second amplifier circuit comprises
a third amplifier transistor having a first third-amplifier-transistor-conduction terminal coupled to the first supply node, a second third-amplifier-transistor-conduction terminal coupled to the second cascode-transistor-control terminal, and a third-amplifier-transistor-control terminal coupled to the amplifier control node,
a fourth amplifier transistor having a first fourth-amplifier-transistor-conduction terminal coupled to the second-cascode-transistor-control terminal, a second fourth-amplifier-transistor-conduction terminal coupled to the first cascode node, and a fourth-amplifier-transistor-control terminal coupled to the first differential node, and
a second resistor having a first terminal coupled to the second differential node and a second terminal coupled to the second-cascode-transistor-control terminal.

22. The voltage regulator of claim 21, wherein the error amplifier further comprises:
a fifth amplifier transistor having a first fifth-amplifier-transistor-conduction terminal coupled to the first cascode node, a second fifth-amplifier-transistor-conduction terminal coupled to a second supply node, and a fifth-amplifier-transistor-control terminal coupled to a second bias reference node; and
a sixth amplifier transistor having a first sixth-amplifier-transistor-conduction terminal coupled to the second cascode node, a second sixth-amplifier-transistor-conduction terminal coupled to the second supply node, and a sixth-amplifier-transistor-control terminal coupled to the second bias reference node.

23. The voltage regulator of claim 22, wherein the error amplifier further comprises a first bias transistor having a first first-bias-transistor-conduction terminal coupled to the first supply node, a second first-bias-transistor-conduction terminal coupled to the first bias node, and a first-bias-transistor-control terminal coupled to a third bias reference node.

24. The voltage regulator of claim 21, wherein the differential input stage comprises:
a first input transistor having a first first-input-transistor-conduction terminal coupled to the first bias node and a second first-input-transistor-conduction terminal coupled to the first cascode node; and a second input transistor having a first second-input-transistor-conduction terminal coupled to the first bias node and a second second-input-transistor-conduction terminal coupled to the second cascode node.

25. The voltage regulator of claim 24, wherein the output stage further comprises a resistive voltage divider coupled from the first output node to a second supply node, an intermediate node of the resistive voltage divider being coupled to a second-input-transistor-control terminal of the second input transistor.

26. The voltage regulator of claim 25, wherein a first-input-transistor-control terminal of the first input transistor is coupled to a bandgap reference node that is configured to receive a bandgap voltage reference signal.

27. The voltage regulator of claim 21, wherein the error amplifier further comprises:

a first balancing transistor having a first first-balancing-transistor-conduction terminal coupled to the first supply node, a second first-balancing-transistor-conduction terminal coupled to the first first-cascode-transistor-conduction terminal, and a first-balancing-transistor-control terminal; and a second balancing transistor having a first second-balancing-transistor-conduction terminal coupled to the first supply node, a second second-balancing-transistor-conduction terminal coupled to the first second-cascode-transistor-conduction terminal, and a second-balancing-transistor-control terminal coupled to the first-balancing-transistor-control terminal, wherein the second-balancing-transistor-control terminal and the second second-balancing-transistor-conduction terminal are coupled together.

* * * * *